United States Patent [19]

Mailhot

[11] Patent Number: 5,061,924
[45] Date of Patent: Oct. 29, 1991

[54] EFFICIENT VECTOR CODEBOOK

[75] Inventor: John N. Mailhot, Somerville, N.J.

[73] Assignee: AT&T Bell Laboratories, Murray Hill, N.J.

[21] Appl. No.: 645,937

[22] Filed: Jan. 25, 1991

[51] Int. Cl.$^5$ .......................... H03M 7/36; H03M 7/42
[52] U.S. Cl. ...................................... 341/76; 341/106; 341/200
[58] Field of Search .................... 341/106, 76, 200, 50, 341/118; 358/133, 135, 136

[56] References Cited

U.S. PATENT DOCUMENTS

| | | | |
|---|---|---|---|
| 4,560,977 | 12/1985 | Murakami et al. | 341/200 X |
| 4,727,354 | 2/1988 | Lindsay | 341/106 |
| 4,811,112 | 3/1989 | Rutledge | 341/50 X |
| 4,811,265 | 5/1989 | Hashimoto et al. | 341/106 X |
| 4,958,225 | 9/1990 | Bi et al. | 341/106 X |
| 4,965,580 | 10/1990 | Tasaki et al. | 341/200 |

OTHER PUBLICATIONS

EIA/TIA Project No. 2215, Cellular System, Dual-Mode Mobile Station–Base Station Compatibility Standard, IS-54 (Incorporating EIA/TIA 553), Dec. 1989, Electronic Industries Association, Engineering Department.

*Primary Examiner*—A. D. Pellinen
*Assistant Examiner*—Sharon D. Logan
*Attorney, Agent, or Firm*—Henry T. Brendzel

[57] ABSTRACT

A vector codebook with an ordered set of vector entries that satisfy a prearranged continuity requirement is used to encode signals. The continuity requirement specifies that consecutively considered vectors may not differ from each other by more than k elements, where k is less than the number of elements in the vectors. In one embodiment, two memories are maintained. One for determining the best codebook vector selection, and one for quantizing the input signal in accordance with the selected vector. Recognizing the possibility that the best ordering possible for a given set of codebook vectors can not satisfy the continuity requirement, the vector codebook arrangement of this invention is enlarged in such a case to include additional vectors that are interposed in the sequence of vectors and arranged to maintain the continuity requirement.

11 Claims, 2 Drawing Sheets

EFFICIENT VECTOR CODEBOOK

BACKGROUND OF THE INVENTION

This invention relates to coding of signals and, more specifically, to coding of signals with the aid of a vector codebook.

Because transmission capacity is often limited, the art of signal transmission relies very heavily on signal coding. In many situations, artisans code the information to compact or compress the information to be transmitted. In others, they code the information to simply send less than all of the provided information. The latter choice results in reception of less than a perfect replica of the provided information. Nevertheless, the reception of less than a perfect replica is often acceptable, because the ultimate recipient of the information either does not *require* the perfect replica, or can accept less than the perfect replica without detrimental defects. For example, a human listening to speech, or viewing an image, is capable of resolving a only limited amount of information. When the information presented to the subject contains more information than can be resolved, some information is simply not perceived. Hence, there is no useful purpose for sending more information than can be perceived. The same occurs with controlled systems, such robots, etc.

Recognizing that not all of the provided information needs to be sent to the receiver, artisans have concentrated their encoding efforts to minimize the error resulting from the loss of data. This error is the difference between the provided information and the information that the recipient, or information sink, can receive with the designed encoding approach.

In a copending application titled "Adaptive Non-Linear Quantizer", Ser. No. 07/626279, filed Dec. 11, 1990, a system for encoding video signals is disclosed. It is a rather complex arrangement where a TV image frame is encoded through a sequence of steps. First, the image frame is divided into segments and each segment is tested against the immediately previous TV image frame. The test develops a motion vector for each segment, which points to the area in the immediately previous image frame that best approximates the tested segment. Based on the developed motion vectors, an approximated current image frame is constructed from the previous image frame. Thereafter, the approximated current image frame is subtracted from the actual current image frame to develop a difference image frame. The difference image frame is then transformed to what might be considered a frequency domain, and the developed coefficients are encoded for transmission. In the course of the encoding process, coefficients are grouped into collections, and each collection is considered as a vector. Taking advantage of the fact that the collections have certain prevalent patterns of coefficient strengths, the amount of information to be transmitted is reduced by truncating some information and by chosing to restrict transmission to only a subset of the possible patterns. The task, in such an arrangement, is to select the best of the permissible patterns (that *would be* transmitted) to represent each of the actual patterns that *ought to be* transmitted.

The selection is carried out by maintaining the permissible patterns in a look-up table, which is commonly referred to as a vector codebook. To determine which of the permissible patterns can best represent a given pattern, each of the vector codebook entries is accessed and compared to the given pattern in accordance with some specified error criteria. The permissible pattern that yields the lowest error measure is selected for transmission. The typical error measuring criteria assesses the error contributed by each of the elements (the developed coefficients) of the selected permissible vector. The overall error is the sum of the errors created by the individual elements.

In devising hardware to perform this selection process, the designer can assess the error contributed by each of the elements either sequentially or in parallel. Parallel operation is much faster, but it requires a substantially larger amount of hardware. Serial operation requires much less hardware, but is much slower.

In the video encoding environment disclosed in the aforementioned application, the speed with which the best permissible codebook vector is identified needs to be high because the time allotted for this determination is very short. On the other hand, parallel operation is unattractive because the codebook vectors contain many elements; and in operation, more elements means more hardware.

It is an object of this invention, therefore, to devise a vector codebook arrangement that can determine the best selection of a permissible codebook vector, with a speed that approaches the speed of the parallel computation approach and with hardware size and complexity that approaches the serial computation approach.

SUMMARY OF THE INVENTION

This and other objects are achieved by creating a vector codebook with an *ordered* set of vector entries that satisfy a prearranged continuity requirement. The continuity requirement states that consecutively considered vectors may not differ from each other by more than k elements, where k is less than the number of elements in the vectors. Recognizing the possibility that the best ordering possible for a given set of codebook vectors can not satisfy the continuity requirement, the vector codebook arrangement of this invention is enlarged in such a case to include additional vectors that are interposed in the sequence of vectors and arranged to maintain the continuity requirement.

DETAILED DESCRIPTION

Figure 1:
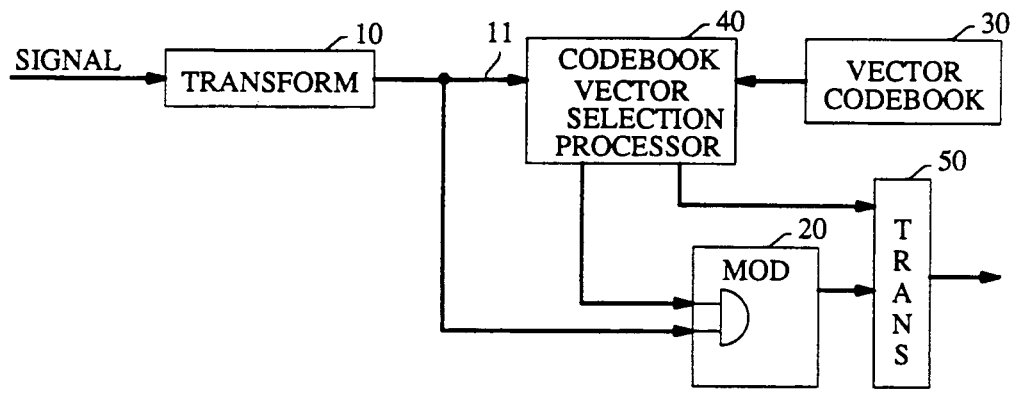
FIG. 1 depicts a circuit that employs a vector codebook encoding approach.

FIG. 1 illustrates a simple circuit where the principles of this invention may be applied. In FIG. 1, the input signal is a time varying signal that is divided into segments. Each segment is applied to transform circuit 10, where a time domain to frequency domain transform is performed. The output of transform circuit 10 is a collection of frequency coefficients, which are energy measures. For convenience, it is assumed that each collection of coefficients developed by circuit 10 appears at the output of circuit 10 in parallel. These coefficients are applied to modulation circuit 20 and to codebook vector selector circuit 40 via bus 11.

Vector codebook element 30 contains a set of vectors or, in applications such as described below, information from which a set of vectors may be derived. Each vector within element 30 has a number of elements and that number is equal to the number of elements in the vectors of circuit 10. Those vectors are applied to circuit 40 and that circuit selects the most appropriate of the codebook vectors for a given collection of coefficients presented on bus 11, and applies the selected codebook vector to modulator circuit 20 and to transmission block 50. The vecor codebook is sparse. That is, whereas the maximum number of possible vectors is $b^N$, where b is the number of values that each element of a vector may assume (assuming that all elements can assume the same number of values) and N is the number of elements in each vector, the number of vectors in the element 30, M, is much less than $b^N$. By "much less" it is meant that M is less than 1% $b^N$.

Circuit 20 selects from among the applied frequency coefficients only the coefficients that correspond to a logic level 1 in the vector supplied by processor 40, and outputs the selected coefficients to transmission block 50. Transmission block 50 encodes the selected frequency coefficients and the codebook vector selected by processor 40 (or a representation of the codebook vector), and applies the encoded signals to the transmission medium. Modulator 20 may be a simple AND gate array, and transmission block 50 may be of any conventional design that is suitable for the particular transmission approach desired for the FIG. 1 system.

It is in the context of apparatus not unlike the FIG. 1 apparatus that the principles of this invention apply.

In accordance with the principles of this invention, the vectors of vector codebook 30 are accessed in a very specific and ordered manner. The order is such that consecutively accessed vectors differ from each other by at most k elements, where k is less than the number of elements in the vectors. As will be evident in greater detail hereinafter, for the purpose of deciding which codebook vector should be selected, codebook 30 need not store the actual codebook vectors. It only needs to store information that properly represents the codebook vectors, or information from which the codebook vectors may be derived. For the modulation function of circuit 20, however, it may be useful to employ the actual vectors.

Since the nature of the vectors in codebook 30 is not known a priori, a situation may arise in specific applications where the best ordering possible for a given set of codebook vectors nonetheless does not yield an ordering where each and every vector differs from the previous vector by at most k positions, or elements. That is, a "gap" may exist in the set of permissible vectors where two adjacent vectors differ by more than k elements (the likelihood of such an event increases as k is decreased). When that situation occurs, in accordance with the principles of this invention the set of vectors stored within vector codebook 30 is augmented with additional vectors that are interposed in the "gaps" and selected to maintain the continuity requirement (of not more than a k element difference between adjacently accessed codebook vectors). This may even mean two consecutive interposed vectors, though that need is expected to arise rarely with reasonable values of k.

To illustrate, table I contains a set of 12 codebook vectors (A through L) having 32 elements each, where a "1" means that a corresponding frequency element of transform circuit 10 is to be transmitted. It is assumed that the ordering of vectors A–L came about from the process that identified the set vectors. That process does not form a part of this invention so it is not described herein.

TABLE I

| | |
|---|---|
| A: | 11100011001011100000000000000000 |
| B: | 11100011001000000000111000000000 |
| C: | 11100011001011100001010100000000 |
| D: | 11100011001000000000000000000000 |
| E: | 11100011001011100000111101100000 |
| F: | 11100011001011100001011100100000 |
| G: | 11100011001011100001110100000000 |
| H: | 11100011001011100001000000100000 |
| I: | 11100011000000001101000000000000 |
| J: | 11000011001011000011000000100000 |
| K: | 11100011000000001101100010000100 |
| L: | 11101111001000001101100010000100 |

In accordance with our invention, the vectors of table I are first ordered. Preferably, the ordering starts with the vector having the smallest number of 1's. One ordered version of the set of vectors if table I is presented in table II. Therein, the underscored vector elements are the elements that differ from corresponding elements in the preceding vector.

TABLE II

| | |
|---|---|
| D: | 11100011001000000000000000000000 |
| A: | 11100011001011100000000000000000 |
| C: | 11100011001011100001010100000000 |
| G: | 11100011001011100001110100000000 |
| E: | 11100011001011100000111101100000 |
| F: | 11100011001011100001011100100000 |
| H: | 11100011001011100001000000100000 |
| J: | 11000011001011000011000000100000 |
| B: | 11100011001011000000100000000000 |
| I: | 11100011000000001101000000000000 |
| K: | 11100011000000001101100010000100 |
| L: | 11101111001000001101100010000100 |

The following attributes may be observed in table II.
The first entry of the table (entry D) contains six 1's;
Most vectors require changes in three positions;
Some vectors require changes in fewer than three positions (e.g., the transition from entry C to entry G requires a change in only one position); and
Some vectors require changes in more than three positions (e.g., the transition from entry G to entry E requires a change in 4 positions, and the transition from entry B to entry I requires a change in five positions).

In accordance with the principles of this invention, the identified gaps between entries C and G, B and I, as well as before the first entry are "filled" by adding three extra vectors (labeled Z) in table III. These vectors serve as vehicles for arriving at a vector selection, but they themselves are not selected.

TABLE III

| | |
|---|---|
| Z: | 11100000000000000000000000000000 |
| D: | 11100011001000000000000000000000 |
| A: | 11100011001011100000000000000000 |
| C: | 11100011001011100001010100000000 |
| G: | 11100011001011100001110100000000 |
| Z: | 11100011001011100001110101100000 |
| E: | 11100011001011100000111101100000 |
| F: | 11100011001011100001011100100000 |
| H: | 11100011001011100001000000100000 |
| J: | 11000011001011000011000000100000 |
| B: | 11100011001011000000100000000000 |
| Z: | 11100011001010001101000000000000 |
| I: | 11100011000000001101000000000000 |

TABLE III-continued

K: 111000110000000011011000100001̄00
L: 111011110010000011011000100001̄00

It may be observed in table III that the information contained in the table *is fully defined* by the information regarding the changes from one vector in the list to the next. For the purpose of selecting the best codebook vector, it is in fact beneficial to operate with that information; i.e., the address of the bits that change, and the nature of the change. In light of the fact that the continuity requirement established for table III is at most three changes from one vector to the next, table IV below is arranged in four sections: the first three sections identify the bits that change (the first 6 bit of each of the three groupings) and the nature of the change (a 1 in the 7th bit indicates a change from 1 to 0), and the fourth section identifies the Z vectors. In other words, the fourth section identifies that activity status of the vector. A 1 means that the vector is inactive (and, hence, may not be selected), and a 0 means that the vector is active. It may be noted that since not all vectors require exactly 3 changes, means must be provided for making no changes at all. This is the function of address 100000 in table IV.

TABLE IV

| | |
| --- | --- |
| Z: | 000000 0 000001 0 000010 0 1 |
| D: | 000110 0 000111 0 001010 0 0 |
| A: | 001100 0 001101 0 001110 0 0 |
| C: | 010011 0 010101 0 010111 0 0 |
| G: | 010100 0 100000 0 100000 0 0 |
| Z: | 011001 0 011010 0 100000 0 1 |
| E: | 010011 1 010110 0 100000 0 0 |
| F: | 010011 0 010100 1 011001 1 0 |
| H: | 010101 1 010110 1 010111 1 0 |
| J: | 000010 1 001110 1 010010 0 0 |
| B: | 000010 0 010010 1 011010 1 0 |
| Z: | 001101 1 010000 0 010001 0 1 |
| I: | 001010 1 001100 1 100000 0 0 |
| K: | 010100 0 011000 0 011101 0 0 |
| L: | 000100 0 000101 0 001010 0 0 |

Figure 2:
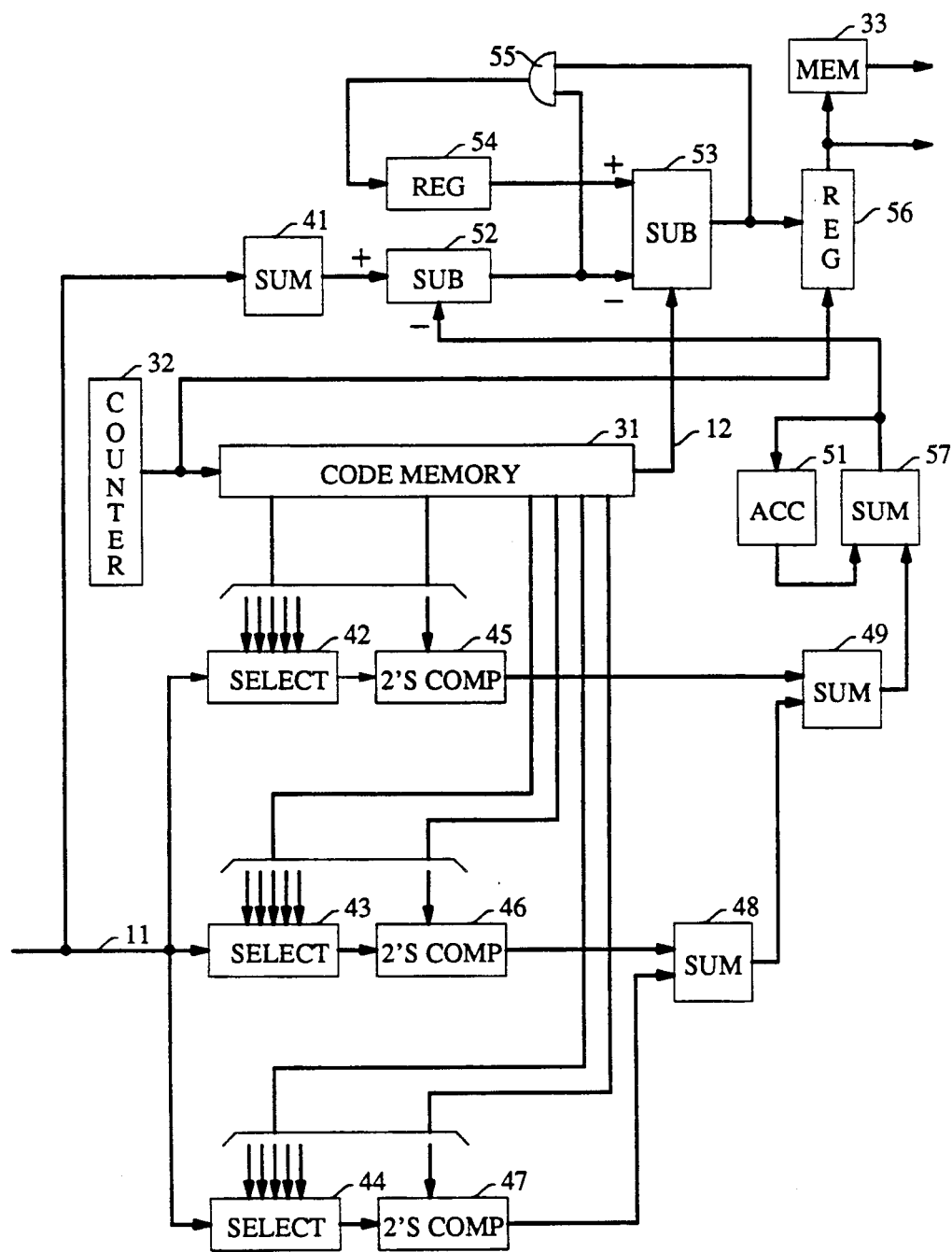
FIG. 2 illustrates one implementation for codebook vector selections in accordance with the principles of this invention.

FIG. 2 depicts one embodiment that performs the function of processors 30 and 40 in accordance with the above-described principles and the above-described structure of the vector codebook memory (table IV). Therein, each collection of transform coefficients is applied by bus 11 to energy summing circuit 41 and to selector circuits 42, 43 and 44. Within energy summing circuit 41, the transform coefficients are summed (most advantageously, in parallel) to develop an overall energy measure for the applied collection of coefficients.

Selectors 42, 43 and 44 are of identical construction. Each is a "1 out of N" selector that selects one of the energy coefficients applied by bus 11, in accordance with an address supplied by codebook memory 31. Vector codebook memory 31 is responsive to counter 32. It outputs the selection addresses for selectors 42, 43 and 44, and cycles through the entire table IV for each collection of coefficients applied to the selectors. The outputs of selectors 42, 43 and 44 are applied to 2's complement circuits 45, 46 and 47, respectively, which are also responsive to the change indication bits of memory 31. A logic "1" control signal at the input of circuit 45 causes the circuit to develop a 2's complement representation of the energy coefficient selected by circuit 42 and applied to circuit 45.

The outputs of circuits 47 and 46 are applied to summing circuit 48, and the outputs of circuits 48 and 45 are applied to summing circuit 49. The output of summing circuit 49 thus represents the difference in the energy measure between the transform coefficients that are called for by the current codebook vector selections and the transform coefficients that correspond to the immediately previous codebook vector selections. That difference is accumulated in register 51 with the aid of adder 57 to result in an energy measure of all of the transform coefficients that correspond to the current codebook vector. That energy measure is applied to subtracter 52. Subtracter 52 is also responsive to circuit 41, and it develops a proximity indication that measures how closely the energy in the coefficients selected by the current codebook vector approaches the overall energy of the transform coefficients developed by circuit 10. A proximity indication that has a low value suggests, of course, that the selected value closely approximates the output of circuit 10.

The proximity indication developed by subtracter 52 is compared in subtracter 53 to information stored in register 54, which is a proximity indication that was previously sorted in register 54. When that comparison indicates that the current proximity indication is better (i.e. has a smaller value), then subtracter 53 enables gate 55 and that allows the current proximity indication to be stored in register 54. Subtracter 53 also enables register 56, which stores the value of counter 32. Thus, at any one time register 54 contains the best proximity indication, and register 56 contains the indentity of the codebook vector that resulted in this current best proximity indication. The output of register 56 is applied to memory 33 which stores the vectors of table III. Both the input and the output signals of memory 33 form outputs of circuit 40. The input to memory 33 is the selected vector's ID, and that is applied to transmit circuit 50. The output of memory 33 (e.g. a ROM) is the selected vector itself, and it is applied to modulator circuit 20.

As suggested above, the storing of the best proximity indication must be interrupted when the current proximity indication is one that results from one of the interposed codebook vectors (a Z vector). This is accomplished through line 12 which emanates from code memory 32 and which disables subtracter 53, as necessary.

As indicated above, in the FIG. 1 arrangement the output of transform circuit 10 may be modulated in modulator 20 merely with an AND gate array. This is because the FIG. 1 system either transmits the coefficient or it does not. Often, however, it is desirable to quantize the signal. In that case, the AND gate array within modulator 20 needs to be replaced with a quantizer array that is guided by the signals applied by the selected codebook vector. This is depicted by quantizer 60 in FIG. 3. (Of course, when the output of circuit 10 is in digital form, it is already quantized; but additional quantization may be desirable. In that sense, the AND gate array within the modulator 20 of FIG. 1 may be said to be a quantizer array with infinite number of steps and no quantization error.)

Quantizer 60 may be fixed in the sense that all signals are quantized similarly, and it may be fixed in the sense that all signals *of particular frequency coefficients* are quantized in one way (while all signals of other frequency coefficients are quantized in a different way). Quantizer 60 may also be variable. As disclosed in the aforementioned application, quantizer 60 may be variable in the sense that it is sensitive to some perceptual characteristics of the overall signal and that, based on those perceptual characteristics of the signal, the coefficients of certain frequencies at times are quantized in one mode and at times are quantized in another mode.

In a system where a variable quantizer array 60 is used, the information sent by transmission block 50 must include information regarding the mode of quantizer 60 vis-a-vis each of the coefficients quantized by it. That can be sent as a separate vector, but in the spirit of reducing information as much as possible, the quantizer mode information may be incorporated in the vectors stored in the vector codebook. When that is the approach taken, the entries of the codebook vectors (of both memories 31 and 33) are no longer 1s or 0s but, rather levels (i.e., numbers) that specify the quantization mode used to encode each of the coefficients.

The principles of this invention operate in full force and effect in such a system. The continuity requirement is still the same; to wit, that differences between successive vectors shall be found in no more than k positions. For example, two adjacently accessed vectors may have the form:

```
3241001200101130000121010000000
32410012001012300001310200000000
```

Figure 3:
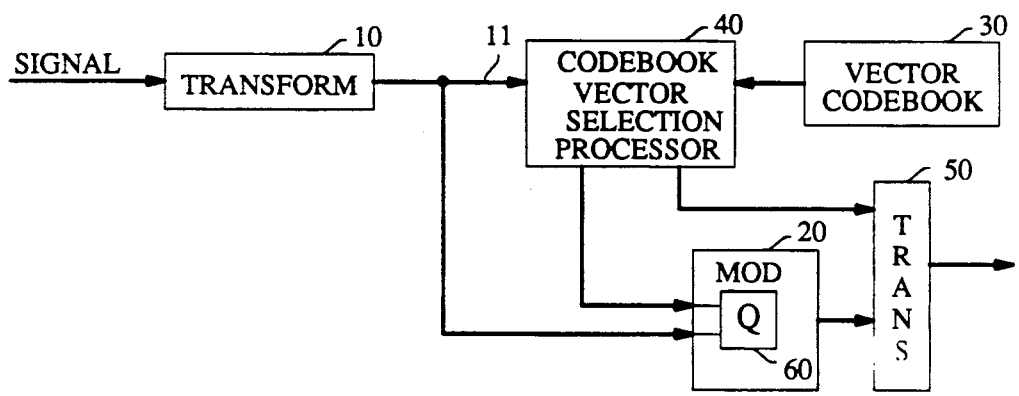
FIG. 3 presents the circuit of FIG. 1 that is augmented with a quantizer.

Again, for convenience the positions where differences exist are underscored. The hardware implementation for the system of FIG. 3 is, expectedly, very similar to the hardware implementation for the FIG. 1 system. The only change is to replace the 2's complement circuit 45, 46, and 47 with modified circuits which are responsive to slightly more complex signals from memory 31. More specifically, in implementing the FIG. 3 arrangement, codebook memory 31 contains the same four sections as in the FIG. 1 arrangement, except that the heretofore 1 bit subfield that specifies whether the change is to be added or subtracted is replaced with a subfield that specifies the previous quantization mode and the new quantization mode. When four quantization modes employed (marked by 0, 1, 2 and 3, where mode 0 means that the signal is not transmitted at all and need not be quantized), a typical table IV entry may thus be as follows:

```
010011 0011 010101 0111 010111 1001 0
``` where the 00–01 second subfield in the first section means a change from mode 0 quantization to mode 3 quantization, the 00–11 second subfield in the second section means a change from mode 1 quantization to mode 3 quantization, and where the 10–01 second subfield in the third section means a change from mode 2 quantization to mode 1 quantization.

Figure 4:
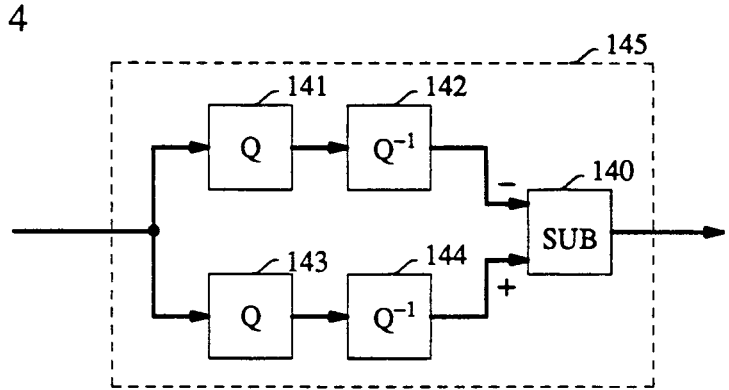
FIG. 4 illustrates the structure of processors that replace the 2's complement processor of FIG. 2, when implementing the FIG. 3 arrangement.

The modified processor 45, designated as processor 145 in FIG. 4, concurrently applies the signal selected by selector 42 to quantizer 141 and quantizer 143. Quantizer 141 quantizes the signal in accordance with the specified previous quantization mode, and quantizer 142 quantizes the signal in accordance with the specified new quantization mode, or regimen. The signal developed by each of the quantizers is inverse quantized in inverse quantizer 142 (connected to quantizer 141) and in inverse quantizer 144 (connected to quantizer 143). The output signal of inverse quantizers 142 and 144 are applied to subtracter 140 which develops the signal applied to summing circuit 49.

The above describes the principles of this invention in connection with a particular embodiment. Of course, variations are clearly possible that are within the spirit and scope of this invention. For example, memory 33 may replace memory 31 (obviating the need for memory 33 at the output of register 56) but means would need to be provided for deriving the information of memory 31.

I claim:

1. A codebook quantizer including a memory for storing a first plurality of quantization information packets, and means connected to said memory for quantizing an applied input signal that comprises a second plurality of elements m, where m is an integer, to be quantized, wherein said means for quantizing evaluates the benefit of quantizing said applied input signal with each of said quantization information packets and, based on said evaluation, selects one of said quantization information packets and quantizes each element of said applied input signal in accordance with a quantization regimen specified for said each element by said selected one of said quantization information packets, and wherein said first plurality is less than one percent of the number of different *quantization regimens definable* by one of said quantization information packets, characterized in that:

said means for quantizing retrieves quantization information packets from said memory in such an order that each retrieved quantization information packet specifies a quantization regimen for said elements of said input signal that differs from the quantization regimen specified for said elements of said input signal by the immediately preceding retrieved quantization information packet in the quantization regimen specification of at most k elements of said input signal, where k is a selected constant less than m.

2. The quantizer of claim 1 wherein each of said quantization information packets is adapted to specify for each of said k elements one of K quantization regimens, where K is greater than 2.

3. The quantizer of claim 1 wherein said means for quantizing comprises a selection section and a quantization section, and where said selection section applies to said quantization section a second plurality of quantization specification codes, each of which specifies a quantization regimen for an element of said input signal.

4. The quantizer of claim 1 wherein
said means for quantizing comprises a selection section and a quantization section,
each quantization information packet in said memory includes information that specifies an activity status of the quantization information packet, the status being either active or inactive, and
said selection section selects a quantization information packet based on said evaluation of benefit, but only from among the quantization information packets having an active status.

5. The quantizer of claim 1 wherein said quantization information packets stored in said memory each comprises k fields, with each field containing
an element specification subfield that specifies one element of said second plurality of input signal elements that is different in its quantization regimen from the quantization regimen of said one element in the immediately previous retrieved quantization information packet, and a change definition subfield for said one element that specifies the nature of the difference in quantization regimens.

6. The quantizer of claim 5 wherein said change definition subfield is a one bit subfield, where a given logic level of said one bit of a retrieved quantization information packet specifies that said one element specified by the associated element specification subfield was included in the benefit evaluation of the immediately previous retrieved quantization information packet and is not included in the benefit evaluation of said retrieved quantization information packet.

7. The quantizer of claim 5 wherein said change definition subfield is a one bit subfield, where a given logic level of said one bit of a retrieved quantization information packet specifies that said one element specified by the associated element specification subfield was included in the benefit evaluation of the immediately previous retrieved quantization information packet and is not included in the benefit evaluation of said retrieved quantization information packet, and where the inverse of said given logic level of said one bit of said retrieved quantization information packet specifies that said one element specified by the associated element specification subfield was not included in the benefit evaluation of the immediately previous retrieved quantization information packet and is included in the benefit evaluation of said retrieved quantization information packet.

8. The quantizer of claim 5 wherein said change definition subfield includes an A sub-subfield and a B sub-subfield, where the A sub-subfield of a retrieved quantization information packet specifies the quantization mode of said one element specified by the associated element specification subfield in the immediately previous retrieved quantization information packet and the B sub-subfield specifies the quantization mode of said one element specified in said retrieved quantization information packet.

9. The quantizer of claim 5 where said means for quantizing further comprises a second memory for storing said plurality of codebook vectors, with each vector comprising a second plurality of vector elements, and with each vector element specifying a quantization regimen for one element of said input signal.

10. A codebook quantizer including a memory for storing a first plurality of quantization information packets, each having a given number of bits, and means for quantizing an applied input signal, which signal comprises a second plurality of elements to be quantized, where said first plurality is less than one percent of the number of different quantization information packets specifyable by said given number of bits; and where said means for quantizing performs an evaluation of the benefit of each of said quantization information packets and, based on said evaluation, selects one of said quantization packets and quantizes said applied input signal in accordance with the selected one of said quantization information packets, characterized in that:

said quantization information packets affects the quantization regimen of at most k elements of said second plurality of elements of said input signal, where k is less than said second plurality.

11. The quantizer of claim 10 wherein each of said quantization information packets is adapted to specify for each of said k elements one of K quantization regimens, where K is greater than 2.

* * * * *

REEXAMINATION CERTIFICATE (2858th)

United States Patent [19]

Mailhot

[11] B1 5,061,924

[45] Certificate Issued Apr. 30, 1996

[54] EFFICIENT VECTOR CODEBOOK

[75] Inventor: John N. Mailhot, Somerville, N.J.

[73] Assignee: American Telephone and Telegraph Company, New York, N.Y.

Reexamination Request:
No. 90/003,789, Apr. 10, 1995

Reexamination Certificate for:
Patent No.: 5,061,924
Issued: Oct. 29, 1991
Appl. No.: 645,937
Filed: Jan. 25, 1991

[51] Int. Cl.$^6$ .............................. H03M 7/36; H03M 7/42

[52] U.S. Cl. .............................. 341/76; 341/106; 341/200

[58] Field of Search .............................. 341/76, 50, 106, 341/118, 200; 358/133, 135, 136

[56] References Cited

FOREIGN PATENT DOCUMENTS 64-41716  2/1988  Japan.

*Primary Examiner*—Brian Young

[57] ABSTRACT

A vector codebook with an ordered set of vector entries that satisfy a prearranged continuity requirement is used to encode signals. The continuity requirement specifies that consecutively considered vectors may not differ from each other by more than k elements, where k is less than the number of elements in the vectors. In one embodiment, two memories are maintained. One for determining the best codebook vector selection, and one for quantizing the input signal in accordance with the selected vector. Recognizing the possibility that the best ordering possible for a given set of codebook vectors can not satisfy the continuity requirement, the vector codebook arrangement of this invention is enlarged in such a case to include additional vectors that are interposed in the sequence of vectors and arranged to maintain the continuity requirement.

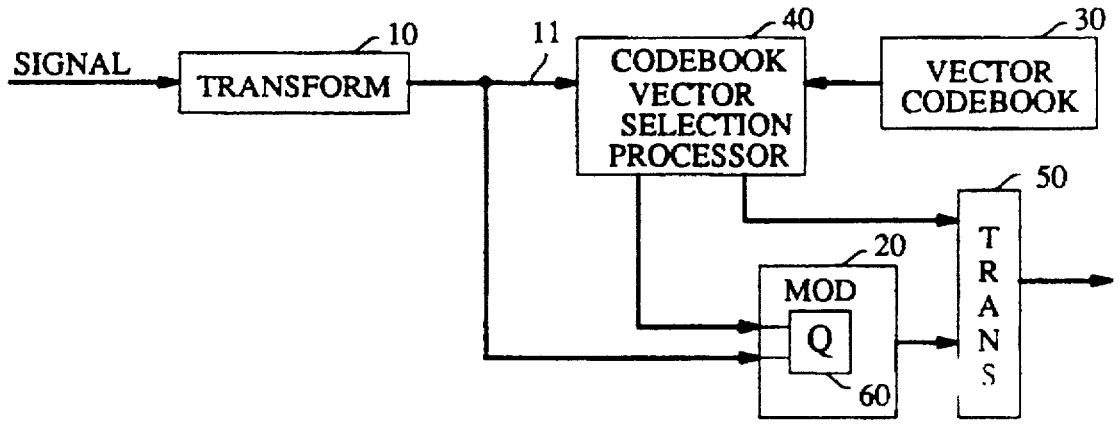

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 2–9 and 11 is confirmed.

Claims 1 and 10 are cancelled.

* * * * *